(12) United States Patent
Rachamadugu et al.

(10) Patent No.: US 8,493,764 B2
(45) Date of Patent: Jul. 23, 2013

(54) HIGH DENSITY CAM ARRAY ARCHITECTURES WITH ADAPTIVE CURRENT CONTROLLED MATCH-LINE DISCHARGE

(75) Inventors: Vinod Rachamadugu, Kurnool (IN); Uddip Roy, Agartala (IN); Setti Shanmukheswara Rao, Bangalore (IN); Nikhil Lad, Bangalore (IN)

(73) Assignee: LSI Corporation, Milpitas, CA (US)

( * ) Notice: Subject to any disclaimer, the term of this patent is extended or adjusted under 35 U.S.C. 154(b) by 234 days.

(21) Appl. No.: 13/024,795

(22) Filed: Feb. 10, 2011

(65) Prior Publication Data

US 2012/0206951 A1 Aug. 16, 2012

(51) Int. Cl.
*G11C 15/00* (2006.01)
(52) U.S. Cl.
USPC .................................. 365/49.17; 365/49.1
(58) Field of Classification Search
USPC ............................... 365/49.17, 49.1
See application file for complete search history.

(56) References Cited

U.S. PATENT DOCUMENTS

| 6,987,682 | B2 * | 1/2006 | Ma et al. | 365/49.15 |
| 7,022,581 | B2 | 4/2006 | Harris et al. | |
| 7,317,628 | B1 * | 1/2008 | Meng | 365/49.17 |
| 7,557,426 | B2 | 7/2009 | Baumgartner et al. | |
| 7,688,610 | B2 * | 3/2010 | Arsovski et al. | 365/49.17 |

* cited by examiner

*Primary Examiner* — Son Dinh
*Assistant Examiner* — Nam Nguyen

(57) ABSTRACT

An integrated circuit having a CAM array includes a plurality of CAM cells organized in rows and columns where each row corresponds to an address word and each column corresponds to a bit position, and a match line for each row connected to be shared by CAM cells in that row. The CAM array also includes a feedback circuit for each row connected to limit a discharge voltage for a corresponding match line in that row. In another aspect, a method of operating an integrated circuit having a CAM array includes organizing a plurality of CAM cells in rows and columns where each row corresponds to an address word and each column corresponds to a bit position, and sharing a match line with CAM cells in each row. The method also includes limiting a discharge voltage for the match line.

20 Claims, 9 Drawing Sheets

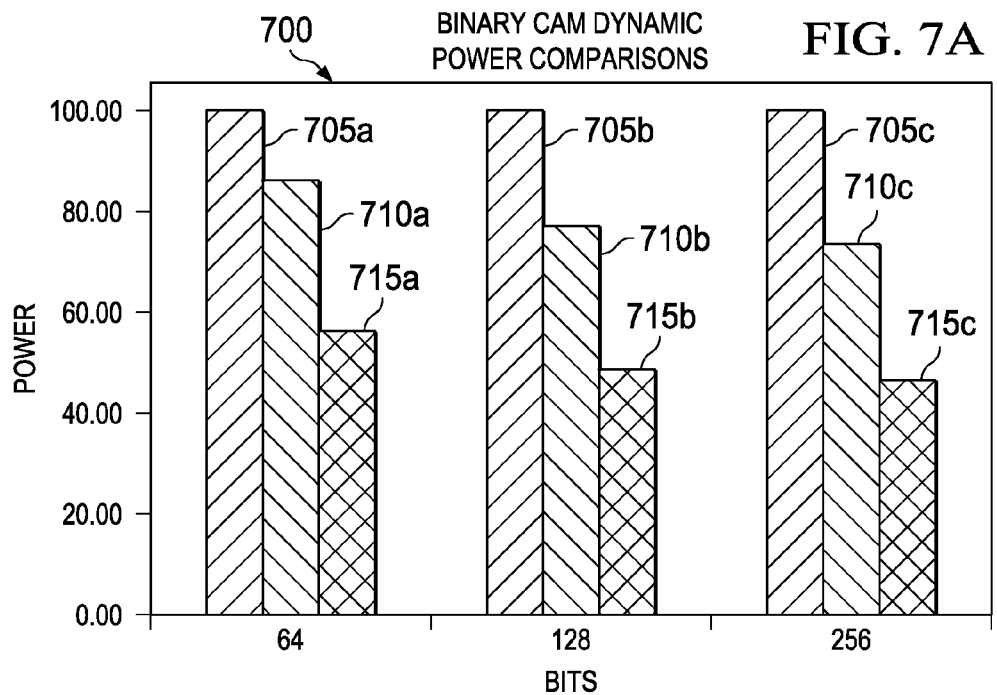
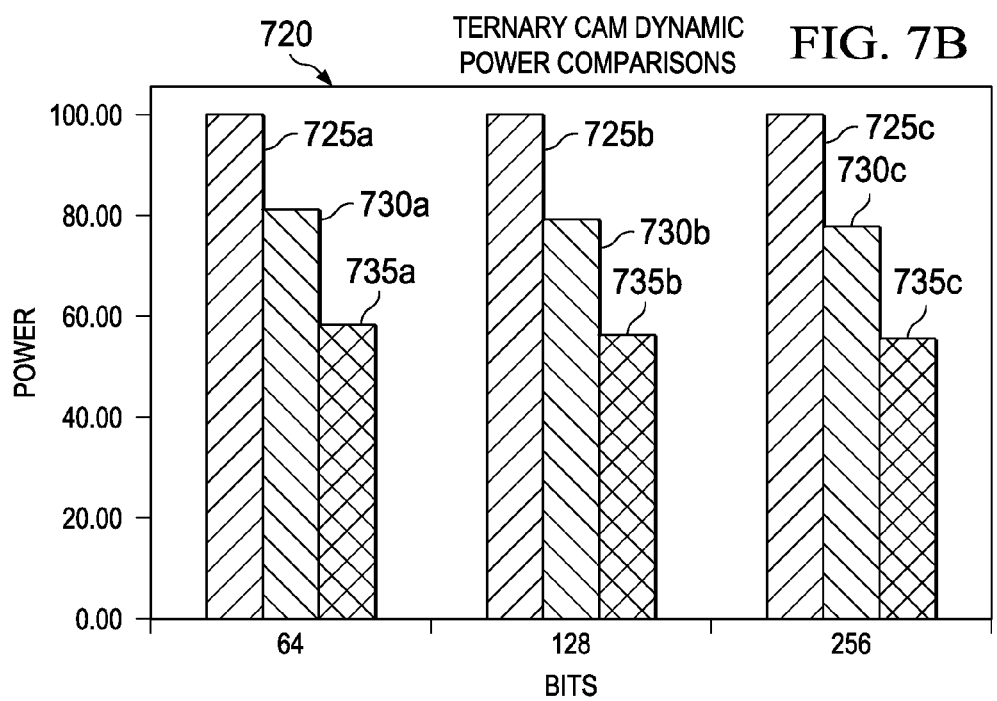

HIGH DENSITY CAM ARRAY ARCHITECTURES WITH ADAPTIVE CURRENT CONTROLLED MATCH-LINE DISCHARGE

TECHNICAL FIELD

This application is directed, in general, to an integrated circuit and, more specifically, to an integrated circuit having a content-addressable memory (CAM) array and a method of operating an integrated circuit having a CAM array.

BACKGROUND

Content-addressable memories (CAMs) are hardware search engines that accomplish search-intensive applications faster than algorithmic approaches. Employed as network search engines, CAMs exhibit performance and dynamic power requirements that are driven by their search capability and density, which is predominantly determined by CAM design. Conventional bitwise XOR or NAND/NOR-based CAM static compare architectures (i.e., CAM cell arrays with static compare) are limited in the areas of density, dynamic power and leakage due to cascaded NAND/NOR comparisons and available interconnects within the CAM array. Additionally, the signal integrity of hit bit lines (HBLs) can degrade significantly based on a column data pattern. Dynamic NOR-based shared match line comparison schemes (i.e., CAM cell arrays with dynamic compare) consume large dynamic power in every comparison cycle. This is due to discharging and charging of associated HBLs and rail-to-rail discharge of match lines in every comparison cycle. Improvement in these areas would prove beneficial to the art.

SUMMARY

Embodiments of the present disclosure provide an integrated circuit having a content-addressable memory (CAM) array and a method of operating an integrated circuit having a CAM array. In one embodiment, the CAM array includes a plurality of CAM cells organized in rows and columns where each row corresponds to an address word and each column corresponds to a bit position, and a match line for each row connected to be shared by CAM cells in that row. The CAM array also includes a feedback circuit for each row connected to limit a discharge voltage for a corresponding match line in that row.

In another aspect, the method of operating an integrated circuit having a CAM array includes organizing a plurality of CAM cells in rows and columns where each row corresponds to an address word and each column corresponds to a bit position, and sharing a match line with CAM cells in each row. The method also includes limiting a discharge voltage for the match line.

The foregoing has outlined preferred and alternative features of the present disclosure so that those skilled in the art may better understand the detailed description of the disclosure that follows. Additional features of the disclosure will be described hereinafter that form the subject of the claims of the disclosure. Those skilled in the art will appreciate that they can readily use the disclosed conception and specific embodiment as a basis for designing or modifying other structures for carrying out the same purposes of the present disclosure.

BRIEF DESCRIPTION

Reference is now made to the following descriptions taken in conjunction with the accompanying drawings, in which:

FIGS. 7A-7D illustrate dynamic power and leakage characteristics corresponding to improvements associated with embodiments of CAM arrays provided in this disclosure.

DETAILED DESCRIPTION

Embodiments of the present disclosure provide content-addressable memory (CAM) array architectures in which a match line discharge is adaptively controlled by negative feedback. In this approach, match line discharge levels are adaptively clamped without discharging and charging search lines (i.e., hit bit lines) in every cycle, which significantly reduces dynamic power and leakage currents while maintaining performance. These clamped match line levels may be detected by single-ended sense amplifiers and converted to digitized raw hit line data. Additionally, these embodiments address binary, X-Y and ternary CAM architectures as may be employed over a wide range of network search engine applications.

Figure 1:
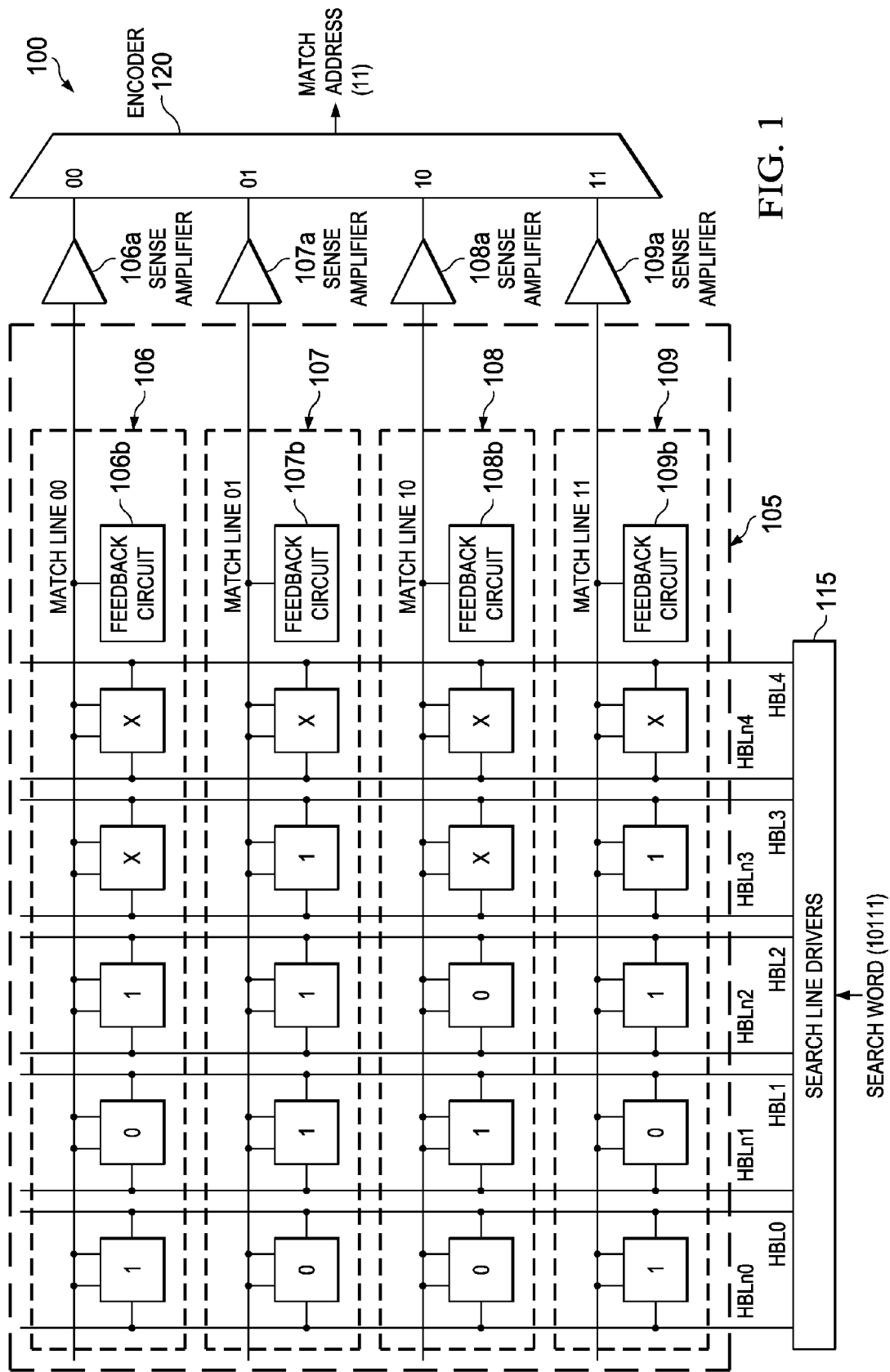
FIG. 1 illustrates a simplified block diagram of an example of a content-addressable memory (CAM), constructed according to the principles of the present disclosure.

FIG. 1 illustrates a simplified block diagram of an example of a content-addressable memory (CAM), generally designated 100, constructed according to the principles of the present disclosure. For simplicity of discussion, the CAM 100 includes a four word by five bit CAM array 105, search line drivers 115 and an encoder 120. The CAM array 105 includes four memory cell rows 106, 107, 108, 109 (corresponding to the four words) wherein each memory cell row includes five memory cells (corresponding to the five bits) having individual storage and comparison circuitry. The search line drivers 115 provide five pairs of search lines (search line pairs HBLn0:HBL0, HBLn1:HBL1, HBLn2:HBL2, HBLn3:HBL3, HBLn4:HBL4) to corresponding columns having four memory cells located in each of the memory cell rows 106, 107, 108, 109.

Each of the memory cell rows 106, 107, 108, 109 employs a match line (match lines 00, 01, 10, 11, respectively) that is connected to each of its five CAM cells, as shown. Each of the match lines 00, 01, 10, 11 is respectively connected to sense amplifiers 106a, 107a, 108a, 109a, which provide match line status to the encoder 120. Match lines 00, 01, 10, 11 are also respectively connected to feedback circuits 106b, 107b, 108b, 109b.

Each of the memory cell rows 106, 107, 108, 109 contains a five bit search word that has been previously stored (employing bit lines and word lines not shown in FIG. 1). In this example, at least one "X" designation is employed in each five bit search word to represent that either a "0" or a "1" state may be stored there. The match lines 00, 01, 10, 11 are pre-charged placing them in a "match" condition. The search line drivers 115 broadcast the search word (10111, in this example) over the search line pairs HBLn0:HBL0, HBLn1:HBL1, HBLn2:HBL2, HBLn3:HBL3, HBLn4:HBL4 to each of the four CAM cells in each search line column.

Memory cells containing bits corresponding to their search lines do not alter the match line pre-charge state even though a small match line leakage current condition exists. However, memory cells containing bits different from their search lines change the match line by discharging its pre-charge state with the exception that those having a stored X state do not affect match line conditions, in this example. Therefore, during search line activation, the match lines 00 and 11 maintain their match condition indicating a match while match lines 01 and 10 discharge thereby providing a mismatch state or condition. In this example, the encoder 120 selects the match line 11 based on it having the most defined bits (i.e., a longest-prefix matching approach) thereby indicating the most direct route to a destination.

Conventionally, a mismatch condition typically causes its associated match line to completely discharge thereby providing a maximum voltage swing from pre-charge. This action contributes to maximize dynamic power requirements and increase leakage currents for the CAM. In the illustrated embodiment of FIG. 1, the feedback circuits 106b, 107b, 108b and 109b generally provide reduced discharge voltages for their respective match lines 00, 01, 10, 11 during a mismatch (discharge) condition thereby reducing dynamic power requirements and leakage currents for the CAM. In the example chosen, the feedback circuits 107b and 108b provide a reduced discharge voltage for corresponding match lines 01 and 10 in their mismatch condition.

Embodiments of the present disclosure provide generic and portable architectures that employ binary, X-Y and ternary CAM cell arrays. These embodiments employ an adaptive current controlled match line discharge scheme using negative feedback that provides clamping of a corresponding match line to reduce dynamic and static power requirements for the binary, X-Y and ternary CAM arrays without significantly impacting performance or density. Match line discharge levels and rates may be configured over a range of search word lengths making applications especially attractive for embedded memories. Additionally, dynamic NOR Cell topology may be employed for the binary, X-Y and ternary CAM arrays that allows a significant reduction in design effort for embedded CAMs.

Figure 2:
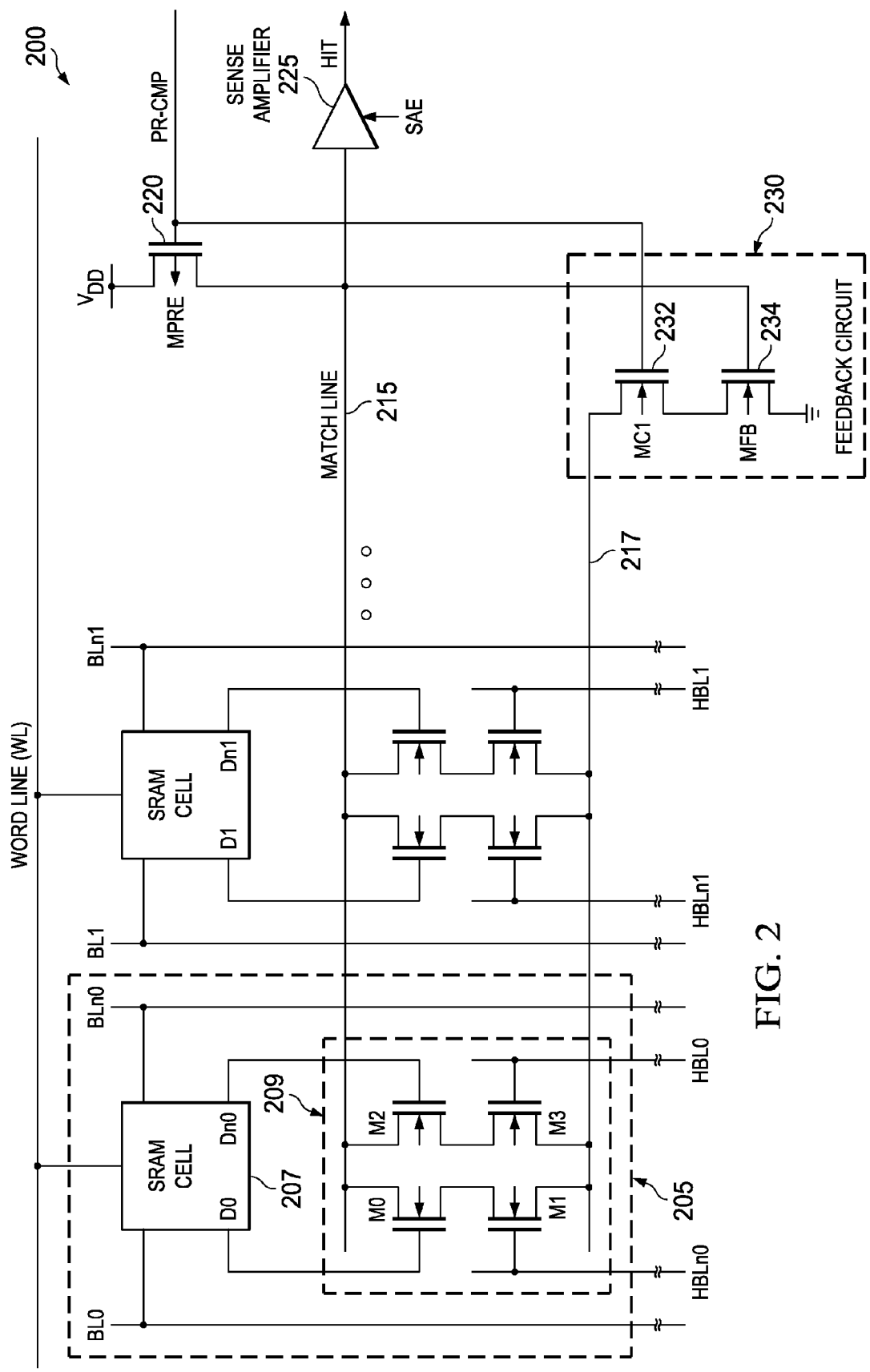
FIG. 2 illustrates an embodiment of a binary CAM cell row, constructed according to the principles of the present disclosure.
Figure 3:
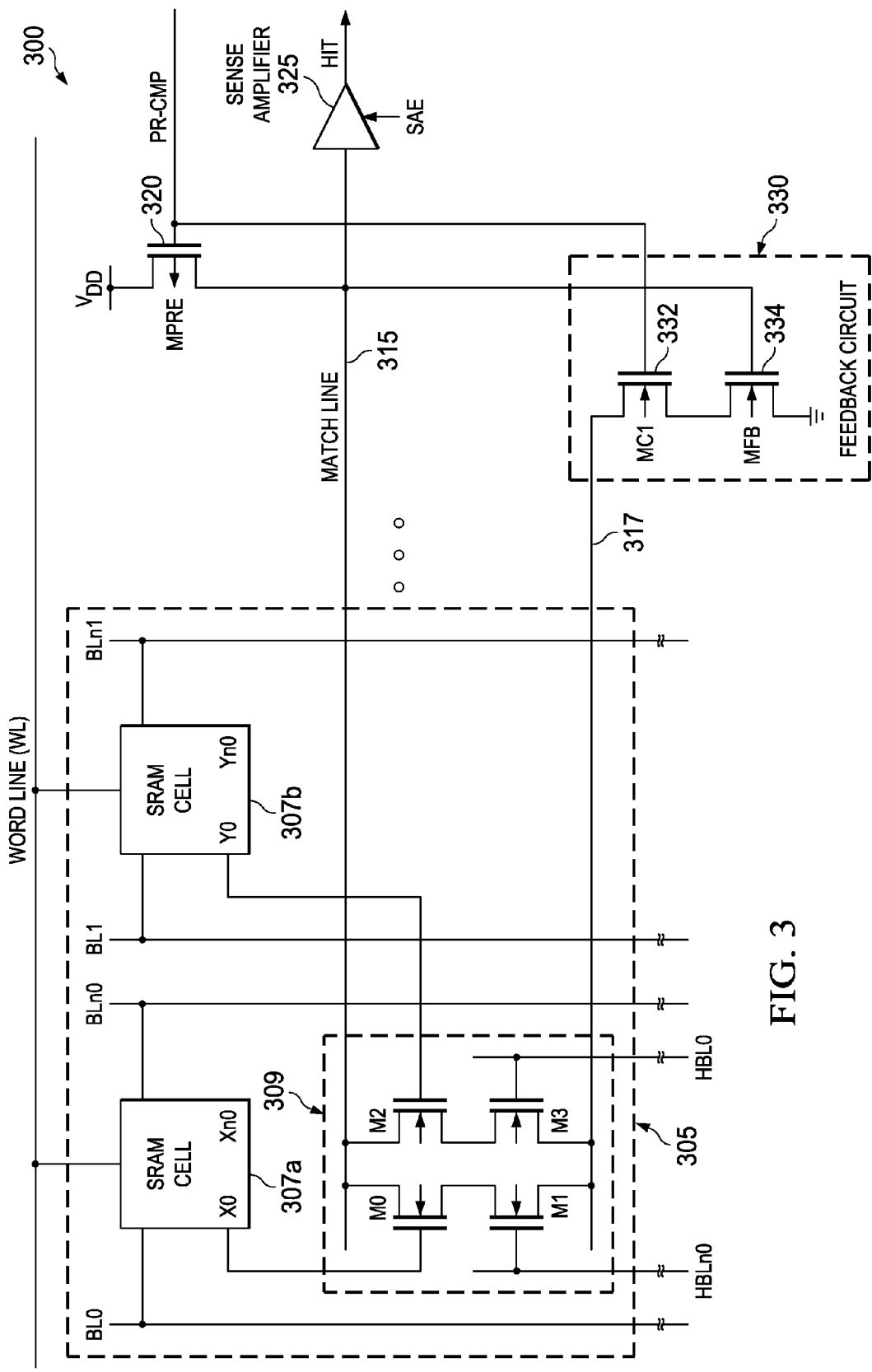
FIG. 3 illustrates an embodiment of an X-Y CAM cell row, constructed according to the principles of the present disclosure.
Figure 4:
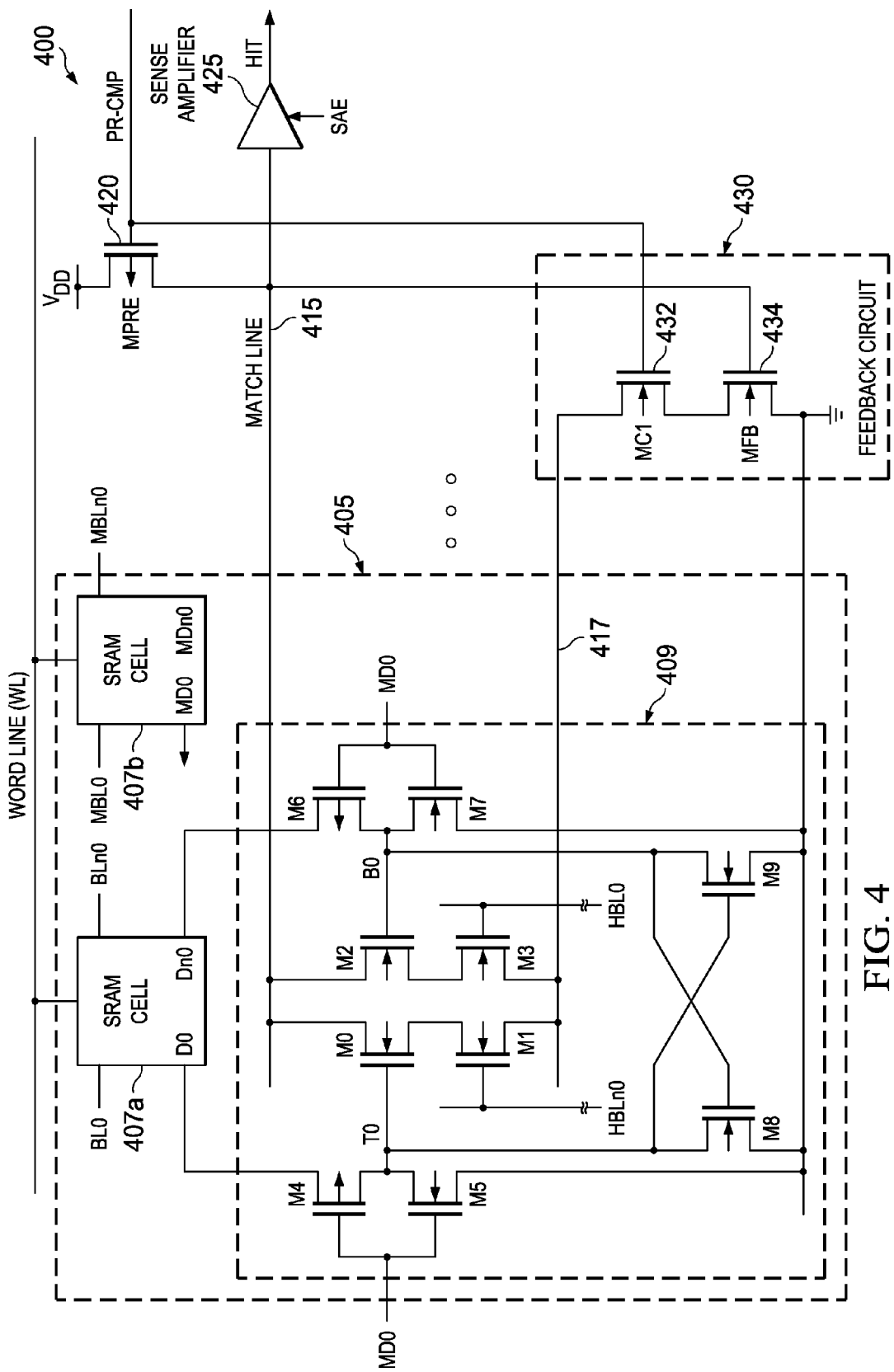
FIG. 4 illustrates an embodiment of a ternary CAM cell row, constructed according to the principles of the present disclosure.
Figure 5:
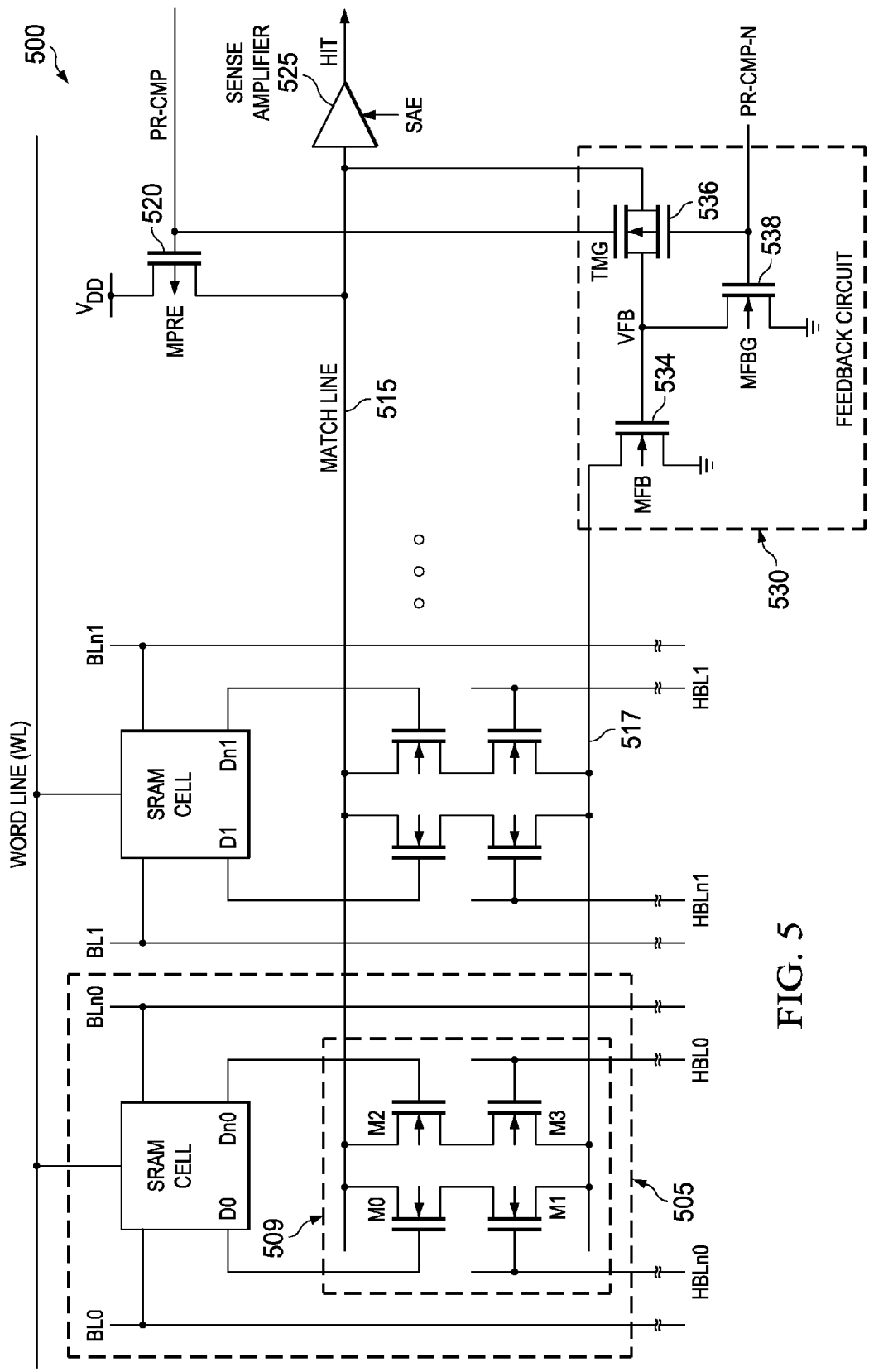
FIG. 5 illustrates another embodiment of a binary CAM cell row, constructed according to the principles of the present disclosure.

FIGS. 2, 3 and 4 below provide examples of binary, X-Y and ternary CAM cell rows employing one embodiment of a match line feedback circuit. FIG. 5 provides another embodiment of a match line feedback circuit applied to a binary CAM cell row, as an example. Additionally, FIGS. 2, 3 and 5 employ a same search line comparison circuit while FIG. 4 employs an expanded search line comparison circuit.

FIG. 2 illustrates an embodiment of a binary CAM cell row, generally designated 200, constructed according to the principles of the present disclosure. The binary CAM cell row 200 may be employed in a binary CAM array and includes a plurality of binary CAM cells wherein the binary CAM cell 205 is typical. Each of the plurality of binary CAM cells in the binary CAM cell row 200 represents a bit in a search word for the binary CAM array. Typical CAM search word lengths may include 64, 128 or 256 bits, for example.

The binary CAM cell row 200 also includes a match line 215, a match line current return 217, a match line pre-charge circuit consisting of a match line pre-charge (MPRE) transistor 220, a sense amplifier 225 and a feedback circuit 230. The binary CAM cell 205 includes a static random access memory (SRAM) cell 207 and a search line comparison circuit 209 employing comparison transistors M0, M1, M2 and M3. The feedback circuit 230 includes a match compare initiate (MCI) transistor 232 and a match feedback (MFB) transistor 234 that are series connected between the match line current return 217 and a common or ground, in this example.

Initially, an address to be subsequently searched is stored in the plurality of binary CAM cells of the binary CAM cell row 200 employing conventional memory bit and word lines. For example, the binary CAM cell 205 stores a search word bit employing bit lines BL0, BLn0 and a word line WL, as shown in FIG. 2. Prior to initiating a search for a word representing a desired address, the MPRE transistor 220 is activated by a pre-compare signal PR-CMP thereby pre-charging the match line 215 to a current sourcing voltage $V_{DD}$.

After the match line 215 is pre-charged to $V_{DD}$ and activation of search bit line pairs (i.e., hit bit line pairs HBLn0:HBL0, HBLn1:HBL1, etc.), the MPRE transistor 220 is deactivated by the pre-compare signal PR-CMP returning to its initial state. Pre-charging the match line 215 activates the MFB transistor 234 and the pre-compare signal PR-CMP returning to its initial state activates the MCI transistor 232 thereby connecting the match line current return 217 to ground. This initiates a simultaneous search of each of the plurality of binary CAM cells in the binary CAM cell row 200.

A search operation of the binary CAM cell 205 employs the comparison transistors M0, M1, M2 and M3 in the search line comparison circuit 209 and may be considered typical of each SRAM cell in the binary CAM cell row 200. As may be seen in FIG. 2, the comparison transistors M0, M1 form a first stacked transistor pair M0:M1, and the comparison transistors M2, M3 form a second stacked transistor pair M2:M3. Activation of both transistors in a stacked transistor pair is required for the match line 215 to discharge. This condition may occur only when a mismatch condition exists.

It can be noted that each pair of gate inputs for the first and second stacked transistor pairs M0:M1, M2:M3 are cross-coupled in a logic sense. That is, SRAM cell output D0 (true state) is coupled with its hit bit line HBLn0 (complement state), and SRAM cell output Dn0 (complement state) is coupled with its hit bit line HBL0 (true state). Table 1 is a truth table for the plurality of binary CAM cells in the binary CAM cell row 200. Column enable control signal CEWE determines a column enable, and column data input control signal CDI reflects the condition of hit bit line HBL.

The first row of Table 1 indicates that the column control signal CEWE is not enabled and therefore any state of the CDI and the SRAM cell output D0 provides a sense amplifier output that is a HIT. In the next four rows, the column control signal CEWE is enabled, and the second and fifth rows also provide sense amplifier outputs that are a HIT, since the states of HBL and D0 are the same. The third and fourth rows provide sense amplifier outputs that are not a HIT (i.e., a MISS or MISMATCH), since the states of HBL and D0 are not the same.

TABLE 1

Truth Table for Binary CAM Cell

| ROWS | INPUTS | | OUTPUT |
|---|---|---|---|
| | CEWE | CDI (HBL) | D0 | SENSE OUT |
| 1 | 0 | XXX | XXX | 1 (HIT) |
| 2 | 1 | 0 | 0 | 1 (HIT) |
| 3 | 1 | 0 | 1 | 0 |
| 4 | 1 | 1 | 0 | 0 |
| 5 | 1 | 1 | 1 | 1 (HIT) |

In the case of a complete word match where all hit bit line pairs (HBLn0:HBL0, HBLn1:HBL1, etc.) are complementary to their respective SRAM cell state pairs (D0:Dn0, D1:Dn1, etc.), the match line 215 discharges only by a few millivolts due to leakage current. For this case, the sense amplifier 225 outputs a signal value of TRUE corresponding to a HIT.

During a typical mismatch condition, multiple combinations of hit bit line pairs (HBLn0:HBL0, HBLn1:HBL1, etc.) are the same as SRAM cell state pairs (D0:Dn0, D1:Dn1, etc.) thereby causing the match line 215 to discharge. This discharge occurs through a discharge path of search line comparison circuits (such as the search line comparison circuit 209), along the match line current return 217 and through the feedback circuit 230. A discharge condition will be evaluated by the sense amplifier 225, which outputs a signal value of FALSE corresponding to a MISMATCH.

Timing wise, the worst case for a compare cycle occurs when there is a mismatch pattern in only one SRAM cell while all other SRAM cells provide a match pattern. In this case, the match line 215 discharges at a lowest discharge rate through only a single search line comparison circuit. Alternatively, when all the stored bits in a word (i.e., all SRAM cells) mismatch with HIT line data inputs, the match line 215 discharges at a highest discharge rate through all search line comparison circuits in parallel.

When the match line 215 begins discharging from $V_{DD}$, the feedback MFB transistor 234 is fully conducting (i.e., fully ON). As the match line 215 continues to discharge, its voltage level drops below $V_{DD}$ thereby reducing a match line discharge current by means of voltage shunt negative feedback. As the match line 215 discharges below the threshold voltage level ($V_T$) of the MFB transistor 234 (about 200 to 300 mV), the discharge path will be interrupted (i.e., opened) and the match line 215 is clamped around the threshold voltage level $V_T$. This clamping provides a reduction in match line voltage swing that typically allows significant savings in dynamic power without impacting compare cycle times as compared to conventional match line discharges that are not clamped.

From the perspective of an embedded CAM, a CAM array may be required to support a wide range of word widths, which typically may range from four to 1024 bits. Since the match line 215 and the match line current return 217 for a row of CAM cells are typically wired by permanent electrical connections (i.e., hard-wired), interconnect routing capacitance and device capacitance increases significantly for larger values of bits per word (e.g., match lines accommodating 256 cells or more). The impact of these capacitance increases is to slow (i.e., increase) response times for the match line 215 and the match line current return 217. However, embodiments of the present disclosure allow reduction of these pre-charge and discharge rates for compare access and cycle times over a wide range of word widths.

The MC1, MFB and MPRE transistors 232, 234, 220 may be sized to accommodate increasing routing and device capacitance associated with an increasing number of bits per word. That is, a current capability of the MC1, MFB and MPRE transistors 232, 234, 220 is increased for a larger number of word bits. This may be accomplished by providing flexible gate width/length (W/L) ratios for the MC1, MFB and MPRE transistors 232, 234, 220.

In one embodiment, the W/L ratio of the MC1 and MFB transistors 232, 234 may increase from about eight to twelve times (8×-12×) for a larger number of word bits over a small number of word bits. Correspondingly, the W/L ratio of the MPRE transistor 220 may increase from about five to fifteen times (5×-15×) for a larger number of word bits over a small number of word bits. These increases allow higher transistor current capacities and shorter charge and discharge times. Of course, this sizing of MC1, MFB and MPRE transistors may be employed in other embodiments of the present disclosure. Additionally, the leakage current of the CAM array embodiments is typically reduced by eliminating additional NAND/NOR-based CAM logic conventionally needed to compare data in every row.

FIG. 3 illustrates an embodiment of an X-Y CAM cell row, generally designated 300, constructed according to the principles of the present disclosure. The X-Y CAM cell row 300 may be employed in an X-Y CAM array and includes a plurality of X-Y CAM cells wherein the X-Y CAM cell 305 is typical. The X-Y CAM cell 305 includes SRAM cells 307a, 307b and a search line comparison circuit 309 employing comparison transistors M0, M1, M2, M3, as before. Each of the plurality of X-Y CAM cells in the X-Y CAM cell row 300 represents a bit in a search word for the X-Y CAM array.

The X-Y CAM cell row 300 also includes a match line 315, a match line current return 317, a match line pre-charge (MPRE) transistor 320, a sense amplifier 325 and a feedback circuit 330. The feedback circuit 330 includes a match compare initiate (MCI) transistor 332 and a match feedback (MFB) transistor 334 that are series connected between the match line current return 317 and a common or ground, in this example.

Generally, operation of the X-Y CAM cell row 300 mirrors that of the binary CAM cell row 200 as discussed with respect to FIG. 2. However, operation of the X-Y CAM cell 305, which includes the two SRAM cells 307a, 307b, is different from the binary CAM cell row 200. Table 2 is a truth table for the plurality of X-Y CAM cells in the X-Y CAM cell row 300. Column control signal CEWE determines a column enable, and control signal CDI reflects the condition of hit bit line HBL, as before.

The first row of Table 2 indicates that the column control signal CEWE is not enabled and therefore any state of the CDI and SRAM cell outputs X0 and Y0 provides a sense amplifier output that is a HIT. In the next eight rows, the column control signal CEWE is enabled, and the second, third, sixth and eighth rows also provide sense amplifier outputs that are a HIT. The fourth, fifth, seventh and ninth rows provide sense amplifier outputs that are not a HIT (i.e., a MISS).

TABLE 2

Truth Table for X-Y CAM Cell

| ROW | INPUTS | | | | OUTPUT |
| --- | --- | --- | --- | --- | --- |
| | CEWE | CDI (HBL) | X0 | Y0 | SENSE OUT |
| 1 | 0 | XXX | XXX | XXX | 1 (HIT) |
| 2 | 1 | 0 | 0 | 0 | 1 (HIT) |
| 3 | 1 | 0 | 0 | 1 | 1 (HIT) |
| 4 | 1 | 0 | 1 | 0 | 0 |
| 5 | 1 | 0 | 1 | 1 | 0 |
| 6 | 1 | 1 | 0 | 0 | 1 (HIT) |
| 7 | 1 | 1 | 0 | 1 | 0 |
| 8 | 1 | 1 | 1 | 0 | 1 (HIT) |
| 9 | 1 | 1 | 1 | 1 | 0 |

FIG. 4 illustrates an embodiment of a ternary CAM cell row, generally designated 400, constructed according to the principles of the present disclosure. The ternary CAM cell row 400 may be employed in a ternary CAM array and includes a plurality of ternary CAM cells wherein the ternary CAM cell 405 is typical. The ternary CAM cell 405 includes SRAM cells 407a, 407b and a search line comparison circuit 409. Each of the plurality of ternary CAM cells in the ternary CAM cell row 400 represents a bit in a search word for the ternary CAM array.

The ternary CAM cell row 400 also includes a match line 415, a match line current return 417, a match line pre-charge (MPRE) transistor 420, a sense amplifier 425 and a feedback circuit 430. The feedback circuit 430 includes a match compare initiate (MCI) transistor 432 and a match feedback (MFB) transistor 434 that are series connected between the match line current return 417 and a common or ground, in this example.

Generally, operation of the ternary CAM cell row 400 mirrors that of the binary CAM cell row 200 as discussed with respect to FIG. 2. However, operation of the ternary CAM cell 405, which includes the two SRAM cells 407a, 407b and the search line comparison circuit 409, is different. The SRAM cell 407a provides a true data output D0 and a complementary data output Dn0. The SRAM cell 407b provides a true mask data output MD0 and a complementary mask data output MDn0, which is not employed.

Table 3 is a truth table for the plurality of ternary CAM cells in the ternary CAM cell row 400. Column control signal CEWE determines a column enable, and control signal CDI reflects the condition of hit bit line HBL, as before. The first row of Table 3 indicates that the column control signal CEWE is not enabled and therefore any state of the CDI and SRAM cell outputs D0 and MD0 provides a sense amplifier output that is a HIT. Additionally, the second row indicates that whenever the SRAM output MD0 is TRUE, the sense amplifier output is a HIT for any state of the column control signal CEWE, the CDI and the SRAM cell output D0. The third and sixth rows provide sense amplifier outputs that are a HIT, while the fourth and fifth rows provide sense amplifier outputs that are not a HIT (i.e., a MISS).

TABLE 3

Truth Table for Ternary CAM Cell

| | INPUTS | | | | OUTPUT |
| --- | --- | --- | --- | --- | --- |
| ROW | CEWE | CDI (HBL) | MD0 | D0 | SENSE OUT |
| 1 | 0 | XXX | XXX | XXX | 1 (HIT) |
| 2 | XXX | XXX | 1 | XXX | 1 (HIT) |
| 3 | 1 | 0 | 0 | 0 | 1 (HIT) |
| 4 | 1 | 0 | 0 | 1 | 0 |
| 5 | 1 | 1 | 0 | 0 | 0 |
| 6 | 1 | 1 | 0 | 1 | 1 (HIT) |

The search line comparison circuit 409 includes four stacked comparison transistor pairs M0:M1, M2:M3, M4:M5, M6:M7 and cross-coupled comparison transistors M8, M9. For the second row in Table 3 where the SRAM cell output MD0 is TRUE, transistors M4 and M6 are deactivated and transistors M5, M7 are activated. This condition places both nodes T0 and B0 at ground thereby deactivating both transistors M0 and M2. The SRAM cell outputs D0 and Dn0 and the hit bit lines HBL0 and HBLn0 are then isolated from affecting the match line 415, regardless of their states. Since the match line 415 has been pre-charged, the sense amplifier output is a HIT, as shown in Table 3.

For the third through the sixth rows of Table 3, the SRAM cell output MD0 is FALSE. For this condition, transistors M4 and M6 are activated and transistors M5 and M7 are deactivated thereby connecting SRAM cell outputs D0 and Dn0 to nodes T0 and B0, respectively.

For the third row, SRAM cell outputs MD0 and D0 and the hit bit line HBL0 are FALSE and the SRAM cell output Dn0 is TRUE. Then, the node B0 is charged to $V_{DD}$ through the transistor M6 and the node T0 is discharged to approximately ground through transistor M4. The node T0 is pulled to ground through transistor M8, which deactivates transistor M9 to maintain the node B0 at $V_{DD}$. As a result, transistors M0 and M3 are deactivated and transistors M1 and M2 are activated resulting in an opening (i.e., blocking or deactivation) of discharge paths for match line 415. This maintains the match Line 415 at its pre-charged voltage $V_{DD}$ resulting in the sense amplifier 425 output providing a HIT. Generally, transistors M8 and M9 assist in restoring the nodes T0 and B0 to ground (or a current sourcing voltage $V_{SS}$, in some embodiments), based on the stored data in the SRAM cell.

For the fourth row, the node T0 is charged to $V_{DD}$ through transistor M4, which restores the node B0 to ground (or $V_{SS}$). Since the hit bit line HBLn0 is set to $V_{DD}$, the match line 415 will discharge towards ground ($V_{SS}$) resulting in a MISS condition for the sense amplifier 425 output.

For the fifth row, the node B0 is charged to $V_{DD}$ through transistor M6 and the node T0 is restored to ground ($V_{SS}$) through the action of transistors M8 and M9. Since the hit bit line HBL0 is set to $V_{DD}$, the match line 415 discharges towards ground ($V_{SS}$) through transistors M2 and M3 resulting in a MISS at the sense amplifier 425 output.

For the sixth row, the node T0 is coupled to $V_{DD}$, and the node B0 is coupled to ground ($V_{SS}$) through the cross coupled transistors M8 and M9. Since the hit line HBLn0 is set to ground ($V_{SS}$) and the hit line HBL0 to $V_{DD}$, the discharge path is again opened, and the match line 415 retains its pre-charged voltage state $V_{DD}$ resulting in a HIT at the sense amplifier 425 output.

FIG. 5 illustrates another embodiment of a binary CAM cell row, generally designated 500, constructed according to the principles of the present disclosure. The binary CAM row 500 may also be employed in a binary CAM array and includes a plurality of binary CAM cells wherein the binary CAM cell 505 is typical. The binary CAM cell row 500 also includes a match line 515, a match line current return 517, a match line pre-charge (MPRE) transistor 520, a sense amplifier 525 and another feedback circuit embodiment, a feedback circuit 530, which is applicable to X-Y and ternary CAM cell rows, as well. The binary CAM cell 505 includes an SRAM cell 507 and a search line comparison circuit 509 employing comparison transistor pairs M0:M1, M2:M3. Each of the plurality of binary CAM cells in the binary CAM cell row 500 represents a bit in a search word for the binary CAM array.

Generally, operation of the binary CAM cell row 500 mirrors that of the binary CAM cell row 200 as discussed with respect to FIG. 2. However, the binary CAM cell row 500 employs the feedback circuit 530, which includes a match line feedback (MFB) transistor 534, a transmission gate (TMG) transistor 536 and a match line feedback gate (MFBG) transistor 538.

The binary CAM cell row 500 depicts an alternate way of clamping the match line 515 voltage level by shifting the MC1 transistor in the feedback circuits 230, 330, 430 of FIGS. 2, 3 and 4 from being series-coupled, as employed before, to a parallel path employing the MFBG transistor 538. Here, the MFB transistor 534 is coupled through an internal feedback node VFB and the TMG transistor 536 to the match line 515. As before, the discharge of the match line 515 is adaptively controlled by the gate voltage of the MFB transistor 534 thereby allowing a reduction in required dynamic power. The MFBG transistor 538 is needed to ensure that the path through the MFB transistor 534 is active only during a compare cycle when the pre-compare signal PR-CMP is set to HIGH.

During non-compare operations, the pre-compare signal PR-CMP is set to LOW, and the complement pre-compare signal PR-CMP-N is set to HIGH. This deactivates the TMG transistor 536 and activates the MFBG transistor 538. Correspondingly, the node VFB is fully discharged to ground deactivating the MFB transistor 534 and thereby maintaining the match line 515 at $V_{DD}$.

The state of the pre-compare signal PR-CMP is LOW prior to a compare cycle thereby pre-charging the match line 515 to $V_{DD}$. During the compare cycle, the pre-compare signal PR-CMP is set to HIGH. When all external compare data bits (the hit line bits HBL0, HBLn0, etc.) match the stored data bits in all SRAM cells (i.e., a HIT condition), all discharge paths for the match line 515 through the parallel comparison transistor pairs (M0:M1, M2:M3, etc.) are open-circuited, irrespective of the state of the pre-compare signal PR-CMP. This condition maintains the match line 515 at its pre-charged voltage state $V_{DD}$, which is coupled to the node VFB through the TNG transistor 536.

During a MISMATCH condition where at least one stored data bit mismatches the hit bit lines (HBL0, HBLn0, etc.), one or more comparison discharge paths formed by the parallel comparison transistor pairs (M0:M1, M2:M3, etc.) are activated and the match line 515 discharges through the MFB transistor 534. At the beginning of match line discharge, the match line voltage $V_{DD}$ is coupled to the node VFB through the TMG transistor 536 thereby providing a maximum value of MFB transistor current.

As the match line 515 discharges from $V_{DD}$, the gate voltage of the MFB transistor 534 is reduced, which also reduces the MFB transistor current thereby reducing the discharge rate of the match line 515. As the voltage value of the match line 515 falls to a value below the threshold voltage $V_T$ of the MFB transistor 534, the MFB transistor 534 deactivates causing the match line 515 to be clamped at a discharge voltage value of about the threshold voltage $V_T$, as before.

Figure 6:
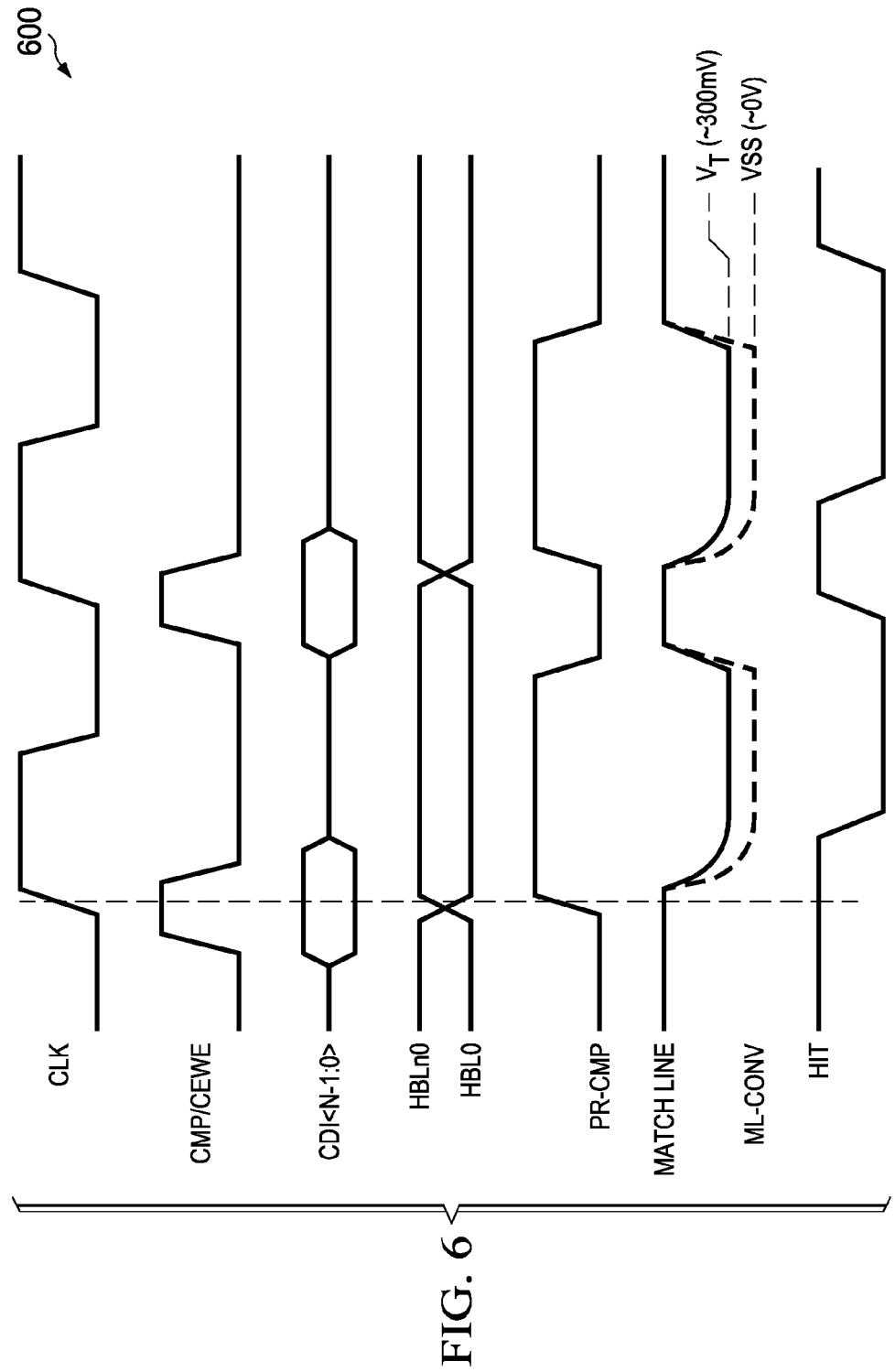
FIG. 6 illustrates a timing diagram for an embodiment of a CAM array, constructed according to the principles of the present disclosure.

FIG. 6 illustrates a timing diagram for an embodiment of a CAM array, generally designated 600, constructed according to the principles of the present disclosure. The timing diagram 600 shows a collection of pertinent waveforms that correspond to operation of embodiments of the CAM arrays previously discussed. For a CAM array, a compare operation is synchronized with the rising edge of a clock signal (CLK). Prior to each compare operation, a pre-charge compare (PR-CMP) signal is set to LOW, which pre-charges the shared match line to a current sourcing voltage $V_{DD}$.

For all binary, ternary and X-Y CAMs during compare, the compare signal CMP is asserted HIGH, data to be compared is asserted on the CDI bus and the CEWE is asserted HIGH. CDI is latched with the rising edge of the CLK and drives HBLn0/HBL0 to LOW/HIGH based on the status of the CDI bus. Once a valid HBLn0/HBL0 condition is setup, the PR-CMP signal is asserted HIGH, which disables the match line pre-charge by deactivating the MPRE transistor in the pre-charge circuit and enables the match line discharge path through the stacked MC1, MFB transistors in the feedback circuit. It may be noted in FIG. 6 that the match line voltage is clamped at the threshold voltage $V_T$ of the MFB transistor, which is about 300 millivolts. A conventional match line (ML-CONV) discharge is indicated to be about zero volts, for comparison.

FIGS. 7A-7D illustrate dynamic power and leakage characteristics, generally designated 700, 720, 740 760, corresponding to improvements associated with embodiments of CAM arrays. Comparisons for the CAM array embodiments are provided, for word lengths of 64, 128 and 256 bits to first and second conventional CAM cell arrays employing static and dynamic compare functions, respectively.

FIG. 7A provides binary CAM dynamic power comparisons 700 between an embodiment of a binary CAM array and first and second conventional binary CAM cell arrays respectively employing static and dynamic compare functions. The first conventional binary CAM array (static compare) of the binary CAM dynamic power comparison 700 shows relative dynamic powers 705a, 705b, 705c having a relative dynamic power value of 100 for each of the word lengths of 64, 128 and 256 bits. The second conventional binary CAM array (dynamic compare) shows relative dynamic powers 710a, 710b, 710c having relative dynamic power values of approximately 84, 76 and 74 for word lengths of 64, 128 and 256 bits, respectively.

Correspondingly, the embodiment of the binary CAM array constructed according to the principles of the present disclosure shows relative dynamic powers 715a, 715b, 715c having relative dynamic power values of approximately 55, 48 and 47 for word lengths of 64, 128 and 256 bits, respectively. These values for the binary CAM array embodiment correspond to dynamic power reductions for 64, 128 and 256 bit word lengths to about 55, 48 and 47 percent of the first conventional binary CAM array and 65, 63 and 64 percent of the second conventional binary CAM array, respectively. Respective average dynamic power reductions correspond to about 50 and 64 percent between the embodiment of the binary CAM array and first and second conventional binary CAM cell arrays employing static and dynamic compare functions.

FIG. 7B provides ternary CAM dynamic power comparisons 720 between an embodiment of a ternary CAM array and first and second conventional ternary CAM cell arrays respectively employing static and dynamic compare functions. The first conventional ternary CAM array (static compare) of the ternary CAM dynamic power comparison 720 shows relative dynamic powers 725a, 725b, 725c again having a relative dynamic power value of 100 for each of the word lengths of 64, 128 and 256 bits. The second conventional ternary CAM array (dynamic compare) shows relative dynamic powers 730a, 730b, 730c having relative dynamic power values of approximately 80, 79 and 78 for word lengths of 64, 128 and 256 bits, respectively.

Correspondingly, the embodiment of the ternary CAM array shows relative dynamic powers 735a, 735b, 735c having relative dynamic power values of approximately 58, 55 and 55 for word lengths of 64, 128 and 256 bits, respectively. These values for the ternary CAM array embodiment correspond to dynamic power reductions for 64, 128 and 256 bit word lengths to about 58, 55 and 55 percent of the first conventional ternary CAM array and 72, 70 and 70 percent of the second conventional ternary CAM array, respectively. Respective average dynamic power reductions correspond to about 56 and 71 percent between the embodiment of the ternary CAM array and first and second conventional ternary CAM cell arrays employing static and dynamic compare functions.

Figure 7C:
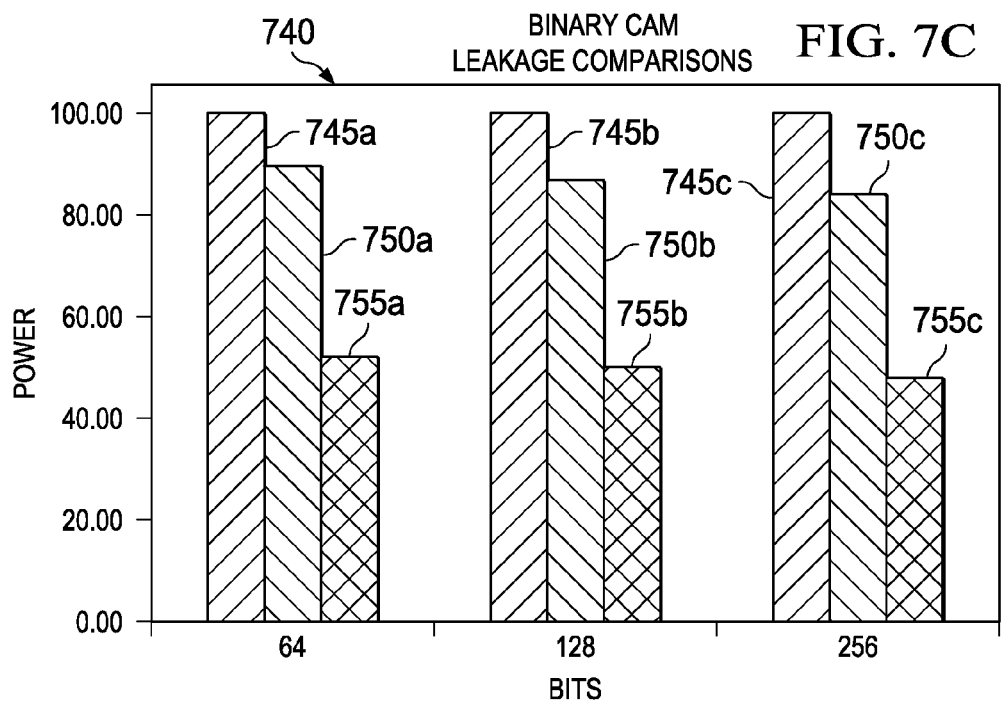

FIG. 7C provides binary CAM leakage comparisons 740 between an embodiment of a binary CAM array and first and second conventional binary CAM arrays respectively employing static and dynamic compare functions. The first conventional binary CAM array (static compare) of the binary CAM leakage comparison 740 shows relative leakages 745a, 745b, 745c having a relative leakage value of 100 for each of the word lengths of 64, 128 and 256 bits. The second conventional binary CAM array (dynamic compare) shows relative leakages 750a, 750b, 750c having relative leakage values of approximately 90, 88 and 85 for word lengths of 64, 128 and 256 bits, respectively.

Correspondingly, the embodiment of the binary CAM array shows relative leakages 755a, 755b, 755c having relative leakage values of approximately 50, 49 and 48 for word lengths of 64, 128 and 256 bits, respectively. These values for the binary CAM array embodiment correspond to leakage reductions for 64, 128 and 256 bit word lengths to about 50, 49 and 48 percent of the first conventional binary CAM array and 55, 56 and 56 percent of the second conventional binary CAM array, respectively. Respective average leakage reductions correspond to about 49 and 56 percent between the embodiment of the binary CAM array and first and second conventional binary CAM cell arrays employing static and dynamic compare functions.

Figure 7D:
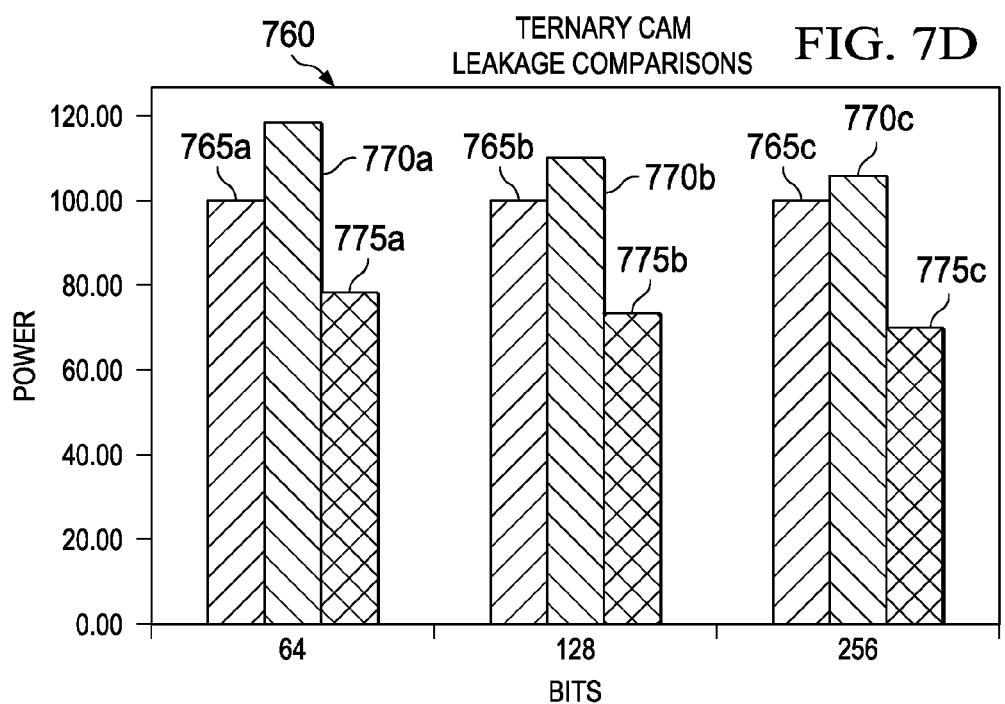

FIG. 7D provides ternary CAM leakage comparisons 740 between an embodiment of a ternary CAM array and first and second conventional ternary CAM array approaches respectively employing static and dynamic compare functions. The first conventional ternary CAM array (static compare) of the ternary CAM leakage comparison 760 shows relative leakages 765a, 765b, 765c again having a relative leakage value of 100 for each of the word lengths of 64, 128 and 256 bits. The second conventional ternary CAM array (dynamic compare) shows relative leakages 770a, 770b, 770c having relative leakage values of approximately 119, 110 and 109 for word lengths of 64, 128 and 256 bits, respectively.

Correspondingly, the embodiment of the ternary CAM array shows relative leakages 755a, 755b, 755c having relative leakage values of approximately 78, 73 and 70 for word lengths of 64, 128 and 256 bits, respectively. These values for the ternary CAM array embodiment correspond to leakage reductions for 64, 128 and 256 bit word lengths to about 78, 73 and 70 percent of the first conventional ternary CAM array and 66, 66 and 64 percent of the second conventional ternary CAM array, respectively. Respective average leakage reductions correspond to about 74 and 65 percent between the embodiment of the ternary CAM array and first and second conventional ternary CAM cell arrays employing static and dynamic compare functions.

Therefore, embodiments of the binary CAM array provide a dynamic power reduction to about 57 percent and a leakage reduction to about 52 percent of the conventional static and dynamic compare binary CAM arrays. Additionally, embodiments of ternary CAM array provide a dynamic power reduction to about 64 percent and a leakage reduction to about 70 percent of the conventional static and dynamic compare binary CAM arrays.

Figure 8:
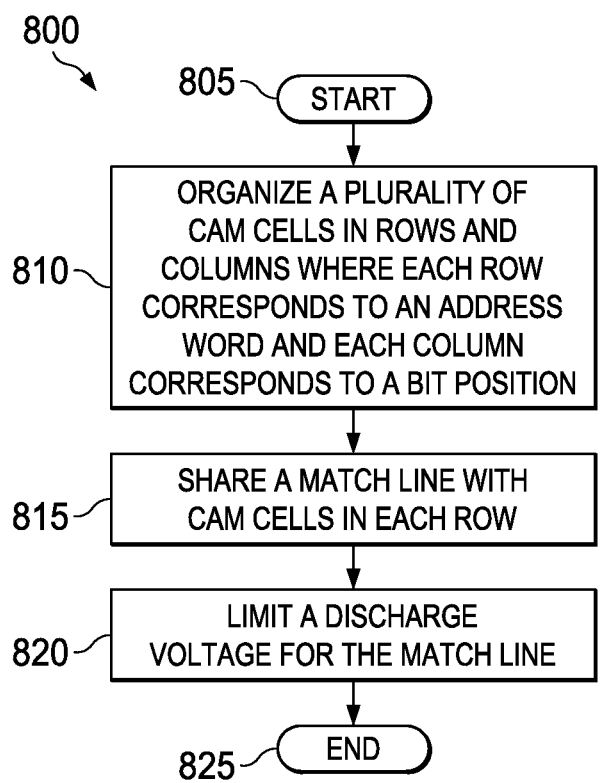
FIG. 8 illustrates a flow diagram of an embodiment of a method of operating an integrated circuit having a CAM array, carried out according to the principles of the present disclosure.

FIG. 8 illustrates a flow diagram of an embodiment of a method of operating an integrated circuit having a CAM array, generally designated 800, carried out according to the principles of the present disclosure. The method 800 start in a step 805 and then, in a step 810, a plurality of CAM cells is organized in rows and columns where each row corresponds to an address word and each column corresponds to a bit position. A match line is shared with CAM cells in each row, in a step 815, and a discharge voltage is limited for the match line, in a step 820.

In one embodiment, limiting the discharge voltage corresponds to employing one selected from a group consisting of a binary CAM cell row an X-Y CAM cell row and a ternary CAM cell row in the CAM array. In another embodiment limiting the discharge voltage permits pre-charging of the match line.

In yet another embodiment, limiting the discharge voltage corresponds to a transistor threshold voltage in a feedback circuit wherein the threshold voltage ranges from about 200 to 300 millivolts. Additionally, limiting the discharge voltage corresponds to connecting a feedback circuit between a comparison circuit in its corresponding row and one selected from the group consisting of a current sinking voltage and a common return point.

In still another embodiment, limiting the discharge voltage provides a specified match line discharge rate. In one case, the specified match line discharge rate is controlled by at least one transistor in a feedback circuit. In another case, the specified match line discharge rate is controlled by tailoring a gate length to width ratio for at least one transistor in a feedback circuit. Additionally, a pre-charge voltage rate for the match line is further provided by tailoring a gate width to length ratio for at least one transistor in a pre-charge circuit. The method 800 ends in a step 825.

While the method disclosed herein has been described and shown with reference to particular steps performed in a particular order, it will be understood that these steps may be combined, subdivided, or reordered to form an equivalent method without departing from the teachings of the present disclosure. Accordingly, unless specifically indicated herein, the order or grouping of the steps is not a limitation of the present disclosure.

Those skilled in the art to which this application relates will appreciate that other and further additions, deletions, substitutions and modifications may be made to the described embodiments.

What is claimed is:

1. An integrated circuit having a content-addressable memory (CAM) array, the CAM comprising:
a plurality of CAM cells organized in rows and columns where each row corresponds to an address word and each column corresponds to a bit position;
a match line for each row connected to be shared by CAM cells in the row; and
a feedback circuit for each row connected to limit a discharge voltage of a corresponding match line for the row.

2. The integrated circuit as recited in claim 1 wherein the feedback circuit limits the discharge voltage corresponding to a transistor threshold voltage in the feedback circuit.

3. The integrated circuit as recited in claim 2 wherein the threshold voltage ranges from about 200 to 300 millivolts.

4. The integrated circuit as recited in claim 1 wherein the feedback circuit limits the discharge voltage of the match line for CAM cells selected from a group consisting of:
a binary CAM cell row;
an X-Y CAM cell row; and
a ternary CAM cell row.

5. The integrated circuit as recited in claim 1 wherein the feedback circuit has an input connected to the match line.

6. The integrated circuit as recited in claim 1 wherein the feedback circuit is connected to provide a specified match line discharge rate.

7. The integrated circuit as recited in claim 6 wherein the specified match line discharge rate is controlled by at least one transistor in the feedback circuit.

8. The integrated circuit as recited in claim 7 wherein the specified match line discharge rate is controlled by tailoring a gate width to length ratio for the at least one transistor in the feedback circuit.

9. The integrated circuit as recited in claim 1 wherein the feedback circuit is connected between a comparison circuit for the row and one selected from the group consisting of:
a current sinking voltage; and
a common return point.

10. The integrated circuit as recited in claim 1 further comprising a match line pre-charge circuit having a gate width to length (W/L) ratio tailored to increase a pre-charge voltage rate for the match line.

11. A method of operating an integrated circuit having a content-addressable memory (CAM) array: comprising:
organizing a plurality of CAM cells in rows and columns where each row corresponds to an address word and each column corresponds to a bit position;
sharing a match line with CAM cells in each row;
limiting a discharge voltage for the match line.

12. The method as recited in claim 11 wherein limiting the discharge voltage corresponds to a transistor threshold voltage in a feedback circuit.

13. The method as recited in claim 12 wherein the threshold voltage ranges from about 200 to 300 millivolts.

14. The method as recited in claim 11 wherein limiting the discharge voltage for the match line corresponds to CAM cells selected from a group consisting of:
a binary CAM cell row;
an X-Y CAM cell row; and
a ternary CAM cell row.

15. The method as recited in claim 11 wherein limiting the discharge voltage permits pre-charging of the match line.

16. The method as recited in claim 11 wherein limiting the discharge voltage provides a specified match line discharge rate.

17. The method as recited in claim 16 wherein the specified match line discharge rate is controlled by at least one transistor in a feedback circuit.

18. The method as recited in claim 17 wherein the specified match line discharge rate is controlled by tailoring a gate width to length ratio for the at least one transistor in the feedback circuit.

19. The method as recited in claim 11 wherein limiting the discharge voltage corresponds to connecting a feedback circuit between a corresponding comparison circuit and one selected from the group consisting of:
   a current sinking voltage; and
   a common return point.

20. The method as recited in claim 11 further comprising increasing a pre-charge voltage rate for the match line by tailoring a gate width to length ratio for at least one transistor in a pre-charge circuit.

* * * * *